United States Patent
Lee et al.

(10) Patent No.: US 8,340,598 B2
(45) Date of Patent: Dec. 25, 2012

(54) DUAL MODE POWER AMPLIFIER

(75) Inventors: MeeLan Lee, Los Altos, CA (US);
William W. Si, San Jose, CA (US);
David J. Weber, Mountain View, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 875 days.

(21) Appl. No.: 12/120,440

(22) Filed: May 14, 2008

(65) Prior Publication Data

US 2008/0284536 A1 Nov. 20, 2008

Related U.S. Application Data

(60) Provisional application No. 60/938,679, filed on May 17, 2007.

(51) Int. Cl.
*H04B 1/02* (2006.01)
(52) U.S. Cl. .................................. 455/103; 455/127.1
(58) Field of Classification Search .............. 455/91, 455/102, 103, 112, 126, 127.1, 127.2, 127.4; 330/277, 280, 282
See application file for complete search history.

(56) References Cited

U.S. PATENT DOCUMENTS

| | | | |
|---|---|---|---|
| 5,771,442 A | 6/1998 | Wang et al. | |
| 6,392,484 B1 | 5/2002 | Takita | |
| 6,504,433 B1 * | 1/2003 | Weber et al. | 330/277 |
| 7,860,467 B2 * | 12/2010 | Pan | 455/127.1 |
| 2006/0115021 A1 | 6/2006 | Puma et al. | |
| 2006/0116091 A1 | 6/2006 | Hammes et al. | |
| 2006/0217090 A1 | 9/2006 | Pan | |
| 2007/0096810 A1 | 5/2007 | Hageman et al. | |

FOREIGN PATENT DOCUMENTS

| | | |
|---|---|---|
| EP | 1492227 A1 | 12/2004 |
| GB | 2389255 A | 12/2003 |

OTHER PUBLICATIONS

International Search Report and Written Opinion—PCT/US2008/063652, ISA/US, Aug. 15, 2008.
Supplementary European Search Report—EP08755494, Search Authority, Munich, Mar. 1, 2011.

* cited by examiner

*Primary Examiner* — Thanh Le
(74) *Attorney, Agent, or Firm* — Bever, Hoffman & Harms, LLP

(57) ABSTRACT

A dual mode power amplifier can include a linear gain section and a non-linear gain section configured together as a polar amplifier. The dual mode power amplifier may be used to transmit GFSK, 4-DPSK, and 8-DPSK modulated data. In one mode, both non-linear and linear gain sections may be used to transmit 4-DPSK and 8-DPSK modulated data. Alternatively, in another mode, the linear gain section may be bypassed while the non-linear gain section may be used to transmit GFSK modulated data. By selecting the operating mode, the dual mode power amplifier may be advantageously configured to use relatively less power while supporting GFSK, 4-DPSK, and 8-DPSK modulation schemes.

9 Claims, 3 Drawing Sheets

DUAL MODE POWER AMPLIFIER

RELATED APPLICATIONS

This application claims priority of U.S. Provisional Patent Application 60/938,679, entitled "Dual Mode Power Amplifier" filed May 17, 2007.

BACKGROUND OF THE INVENTION

1. Field of the Invention

Embodiments of the present invention generally relate to wireless communications and more particularly to dual mode power amplifiers.

2. Description of the Related Art

Wireless communications systems generally use radio frequency (RF) signals to transmit data from a transmitter to one or more receivers. Wireless communication systems are frequently used to implement wireless local area networks (LANs) in which data is transmitted and received between computers, servers, Ethernet switches, hubs, and the like.

There are many modulation schemes that may be used to encode and transmit data. Bluetooth™ devices, for example, may use three different modulation schemes as currently set forth in the Bluetooth SIG specification v2.0.

A first modulation scheme uses Gaussian frequency-shift keying (GFSK) which encodes data by modulating a carrier frequency of between 2402 and 2480 MHz by +/−160 KHz. This modulation scheme is one of the relatively early schemes employed for earlier Bluetooth™ products. This modulation scheme may transmit up to 1 Mbs.

A second modulation scheme, 4-Differential Phase Shift Keying (DPSK) encodes data by modulating the phase of a carrier frequency to one of four possible phase settings. The 4-DPSK modulation scheme can support up to 2 Mbs of throughput. A third modulation scheme, 8-DPSK encodes bits by modulating the phase of a carrier frequency to one of eight fixed phases and can support up to 3 Mbs of throughput. Again, in the second and third modulation schemes, the carrier frequency may be between 2402 and 2480 MHz.

The GFSK modulation scheme may be realized in hardware with a relatively simple non-linear power amplifier. One example of a non-linear power amplifier is a switching power amplifier. Switching power amplifiers advantageously use relatively small amounts of power. FIG. 1 is a conceptual drawing of a switching power amplifier 100. To transmit a GFSK modulated signal, a desired modulating frequency f(t) is coupled to the input of switching power amplifier 100, as shown. In some embodiments, switching power amplifier 100 may apply an amount of gain to the coupled input. In this exemplary switching power amplifier, an amount of gain A is applied to the modulating frequency f(t), thereby producing an output of Af(t). The output of switching power amplifier 100 may be coupled to an antenna 101. Switching power amplifier 100 works relatively well for transmitting GFSK modulated signals because the amplitude of the transmitted signal is relatively constant while the frequency of the transmitted signal changes in response to the modulating frequency f(t).

In contrast, the 4-DPSK and 8-DPSK modulation schemes are often realized with linear power amplifiers. The 4-DPSK and 8-DPSK modulation schemes are relatively more complicated than GFSK modulation and generally use linear power amplifiers configured with either Cartesian or polar inputs. A Cartesian amplifier typically includes i(t) and q(t) modulating inputs while a polar amplifier typically includes frequency f(t) and amplitude a(t) inputs. FIG. 2 is a conceptual diagram of a linear polar amplifier 200 with frequency f(t) and amplitude a(t) inputs. As is well-known, the output of a linear polar amplifier may be described by the equation a(t)×f(t). One drawback of a linear amplifier is that it typically uses relatively more power compared to a non-linear amplifier (e.g. switching power amplifier 100). Using more power may be undesirable, especially for battery-powered transmitter designs.

In some designs when it may be desirable to support both GFSK and DPSK modulation schemes, it may be useful to include both a non-linear power amplifier along with a linear power amplifier in the design. The non-linear power amplifier may provide a power-saving amplifier for GFSK signals, while the linear power amplifier may be used for DPSK modulation schemes. A drawback to this approach is that additional die area may be required to support both power amplifier designs in a single integrated circuit.

As the foregoing illustrates, what is needed in the art is a power amplifier that supports both relatively low power GFSK modulation as well as 4-DPSK and 8-DPSK modulation while using relatively little die area.

SUMMARY OF THE INVENTION

A dual mode power amplifier can be advantageously used to transmit GFSK, 4-DPSK, and 8-DPSK modulated data. A dual mode power amplifier can include a non-linear gain section, a linear gain section, and a mixer. In one mode, both non-linear and linear gain sections may be used to transmit 4-DPSK and 8-DPSK modulated data. Alternatively, in another mode, the linear gain section may be bypassed while the non-linear gain section may be used to transmit GFSK modulated data.

To provide this functionality, the non-linear gain section can receive frequency modulating inputs and a first gain signal. The linear gain section can receive amplitude modulating inputs, the first gain signal, and a mode select signal. The mixer can receive outputs of the non-linear gain section and the linear gain section, and generate a mixed signal as an output of the dual mode power amplifier. The non-linear gain section can include a switching amplifier that receives the frequency modulating inputs and the first gain. In one embodiment, the switching amplifier can include a plurality of transistor structures, wherein each transistor structure can include breakdown-resistant transistors.

The linear gain section can include a mode controller, a linear amplifier, and a multiplexer controlled by the mode controller. The mode controller can receive the mode select signal and the first gain signal. The linear amplifier can receive the amplitude modulating inputs and a second gain signal output by the mode controller. The multiplexer can receive an output of the linear amplifier and a constant, and generate an output of the linear gain section.

In this configuration, the dual mode power amplifier can provide both GFSK and DPSK modulation. Specifically, the linear gain section can be configured in a normal mode or a bypass mode. When the linear gain section is configured in the bypass mode, an output of the linear gain section is a constant value (e.g. unity) and thus the dual mode power amplifier output signal is GFSK modulated. In contrast, when the linear gain section is configured in the normal mode, the amplifier output signal is DPSK modulated. By selecting the operating mode, the dual mode power amplifier may be advantageously configured to use relatively less power while supporting GFSK, 4-DPSK, and 8-DPSK modulation schemes.

DETAILED DESCRIPTION

Figure 1:
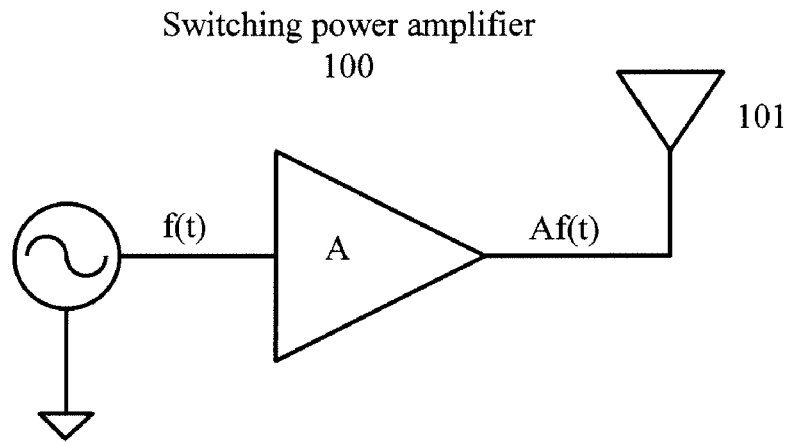
FIG. 1 is a conceptual drawing of a switching power (non-linear gain) amplifier.
Figure 2:
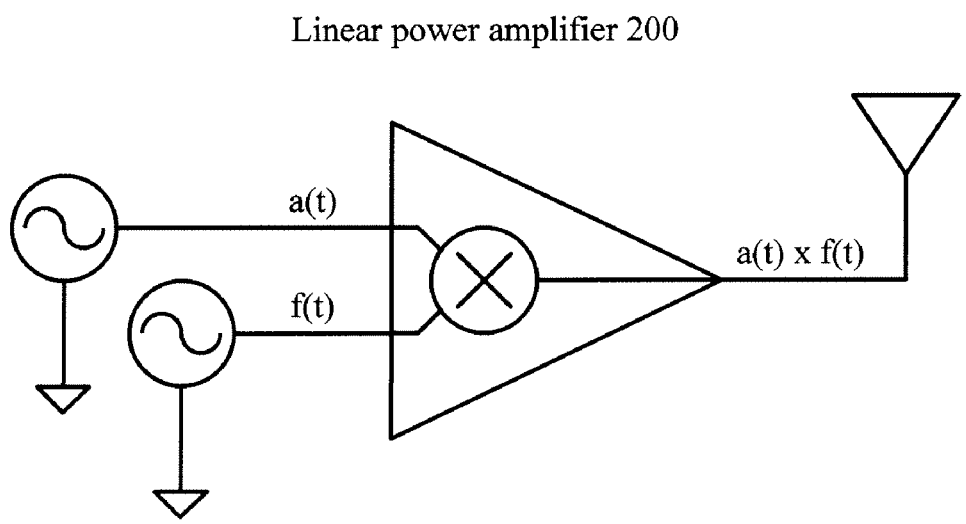
FIG. 2 is a conceptual diagram of a linear power (linear gain) amplifier with frequency and amplitude inputs.
Figure 3:
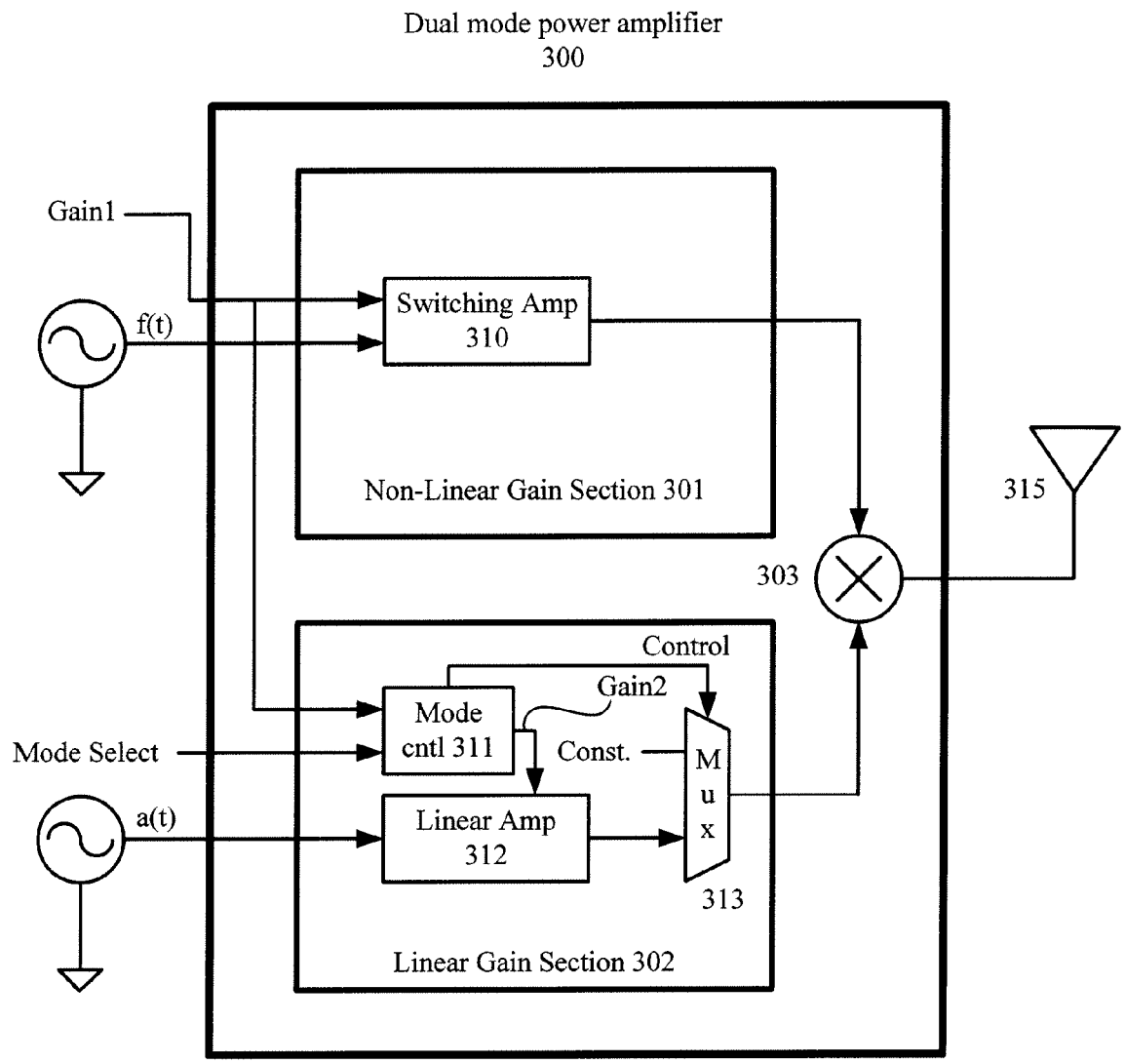
FIG. 3 is a conceptual diagram of a dual mode power amplifier configured according to one or more aspects of the specification.

FIG. 3 is a conceptual diagram of a dual mode power amplifier 300 configured according to one or more aspects of the specification. Dual mode power amplifier 300 can include a non-linear gain section 301, a linear gain section 302, and a two-input mixer 303. The outputs of non-linear gain section 301 and linear gain section 302 are coupled together through mixer 303, thereby configuring dual mode power amplifier 300 as a polar amplifier. In one embodiment, mixer 303 may be incorporated within either non-linear gain section 301 or linear gain section 302. The output of mixer 303 is the output of dual-mode amplifier 300, wherein such output can be coupled to an antenna 315.

Linear gain section 302 can include a mode controller 311, a linear amplifier 312, and a multiplexer 313. A Mode Select signal and a Gain1 signal are coupled to inputs of mode controller 311. Amplitude modulating inputs a(t) are coupled to an input of linear amplifier 312. Linear amplifier 312 may apply a Gain2 signal (output by mode controller 311) linearly to the amplitude modulating inputs a(t), generally in an amount proportional to the magnitude of the amplitude modulating inputs. Additionally, the gain amount of linear amplifier 312 may be adjusted higher or lower in an amount proportional to the Gain2 signal.

Multiplexer 313 includes first and second inputs. The output of linear amplifier 312 is coupled to the first input and a constant value is coupled to the second input. Mode controller 311 receives a Mode Select signal that determines a value of a Control signal that controls the input selection of multiplexer 313, i.e. whether the output from linear amplifier 312 or the constant value is selected. In one embodiment, the Mode Select signal may be configured by software.

If mode controller 311 configures multiplexer 313 to select the output of linear amplifier, then linear gain section is configured to operate normally and the output of linear amplifier 312 is coupled through multiplexer 313 to a first input of mixer 303. On the other hand, mode controller 311 may configure linear gain section 302 to operate in bypass mode by selecting the constant value. In this configuration, the constant value is coupled through multiplexer 313 to the first input of mixer 303, thereby effectively bypassing the output of linear amplifier 312. In one embodiment, the constant value may be a unity value so that the output of mixer 303 is substantially determined by the output of non-linear gain section 301.

Non-linear gain section 304 includes a switching amplifier 301, wherein the Gain1 signal and the frequency modulating inputs f(t) are coupled to inputs of switching amplifier 301. Switching amplifier 310 may apply a Gain1 signal non-linearly to the frequency modulating inputs f(t). Additionally, the gain of switching amplifier 310 may be adjusted higher or lower in an amount proportional to the Gain1 signal. In one embodiment, the gain of switching amplifier 310 may be proportional to the magnitude of the modulating frequency inputs f(t). The output of switching amplifier 310 is coupled to the second input of mixer 303.

When the Mode Select signal configures linear gain section 302 to operate normally, the output for dual mode power amplifier 300 is determined by mixing the output of linear gain section 302 and non-linear gain section 301. On the other hand, when the Mode Select signal configures linear gain section 302 to be bypassed, the output of dual mode power amplifier 300 may be substantially determined by non-linear gain section 301 because the first input of mixer 303 is fixed to a constant value.

To transmit 4-DPSK or 8-DPSK modulated signals using dual mode power amplifier 300, the frequency modulating inputs f(t) are coupled to non-linear gain section 301, amplitude modulating inputs a(t) are coupled to linear gain section 302, a Gain2 signal is determined by the Gain1 signal, and the Mode Select signal is configured such that linear gain section 302 operates normally. At this point, the Gain1 signal is applied to the frequency modulating inputs f(t). Note that switching amplifier 310 may adjust the Gain1 signal by an amount proportional to the Gain1 signal. The Gain2 signal is applied to the amplitude modulating inputs a(t) in an amount proportional to the magnitude of the amplitude modulating inputs. Note that mode control 311 may adjust the Gain 2 signal by an amount proportional to the Gain1 signal. As described above, the outputs of the linear and non-linear gain sections are mixed together by mixer 303 and determine the output of dual mode power amplifier 300.

On the other hand, to transmit GFSK modulated signals, the frequency modulating inputs f(t) are coupled to non-linear gain section 301, a gain amount is determined by switching amplifier 310 based the Gain1 signal, and the Mode Select signal is configured such that linear gain section 302 is bypassed. Non-linear gain section 301 applies the Gain1 signal to the frequency modulating inputs f(t) (wherein such gain may be adjusted by an amount proportional to the Gain1 signal). Again, the outputs of the linear and non-linear gain sections are mixed together by mixer 303 and form the output of dual mode power amplifier 300. However, in this case, because linear gain section 302 produces a constant value, the output of dual mode power amplifier 300 is substantially determined by non-linear gain section 301. When transmitting GFSK modulating signals, dual mode power amplifier 300 advantageously may use relatively less power because linear gain section 302 is bypassed and dual mode power amplifier operates substantially as a non-linear amplifier.

Figure 4:
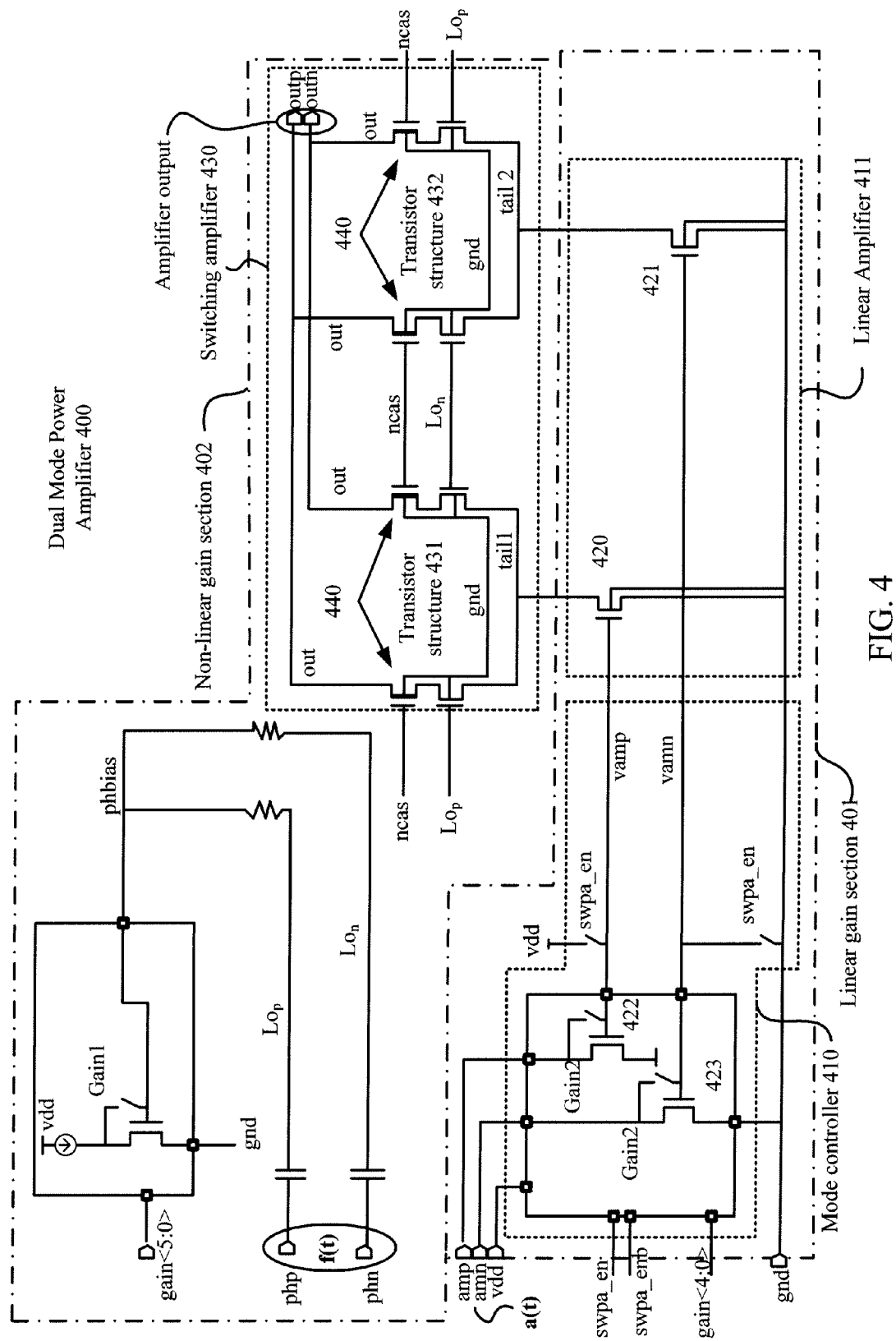
FIG. 4 is a schematic diagram of one embodiment of a dual mode power amplifier configured according to one or more aspects of the specification.

FIG. 4 is a schematic diagram of one embodiment of a dual mode power amplifier 400 configured as a polar transmitter according to one or more aspects of the specification. Dual mode power amplifier 400 includes a linear gain section 401 and a non-linear gain section 402. A gain signal is coupled to both linear gain section 401 and non-linear gain section 402. In one embodiment, the gain signal is implemented as a six bit digital signal that is coupled to dual mode power amplifier 400, wherein non-linear gain section 402 may use six bits of the digital signal (gain<5:0>) and linear gain section may use five bits of the digital signal (gain<4:0>).

Frequency modulating inputs f(t) are coupled to non-linear gain section 402 (via pads php and phn) and amplitude modulating inputs a(t) are coupled to linear gain section 401 (via pads amp and amn). As shown, the frequency and amplitude modulating inputs may be configured to accept data in a differential format. In other embodiments, the frequency and amplitude inputs may accept data in a single-ended format.

Linear gain section 401 includes a mode controller 410 and a linear amplifier 411. The gain signal, the mode selection signal (i.e. swpa_en and swpa_enb), and the amplitude modulating inputs a(t), are coupled to mode controller 410. Mode controller 410 configures linear gain section 401 to either operate normally or be bypassed by configuring devices within mode controller 410 and linear amplifier 411. Note that in FIG. 4, transistors 420 and 421 form a current mirror with transistors 422 and 423. This current mirror ratio can be set by the Gain2 signal. The current applied at amp and amn can be amplified by the current mirror ratio between transistors 422 and 420, and transistors 423 and 421.

In one embodiment, the functionality of multiplexer 313 (FIG. 3) may be realized by devices distributed within mode controller 410 and linear amplifier 411. In this embodiment, multiplexer 313 is effectively implemented by a switch that connects vamp and vamn either to the voltage created by a time-varying differential current applied to diodes 422 and 423 in linear mode, or to a constant voltage vdd and gnd in the non-linear mode. This switch (multiplexer) is controlled by signal swpa_en. In the linear mode, one of the inputs to the multiplexer is implemented by allowing the mixer inputs to be connected to a differential current input that represents the amplitude modulated data. This modulated current data is applied to amp and amn, which is mirrored (with gain) to transistors 420 and 421 as a linear current input to the mixer. In the non-linear mode, the second input to the multiplexer becomes a constant value by pulling tail1 to ground and allowing tail2 to go to high impedance. This is implemented by selecting a switch that pulls the gate of transistor 420 to vdd and the gate of transistor 421 to ground.

Mode controller 410 may process the amplitude modulating inputs a(t) to generate intermediate signals vamn and vamp, which are coupled to the inputs of linear amplifier 411. This processing may include, among other things, biasing the intermediate signals so that linear amplifier 411 may apply additional gain in an amount proportional to the gain signal.

In this embodiment, linear amplifier 411 includes two transistors 420 and 421 whose gates receive intermediate signals vamp and vamn, respectively. In this configuration, transistors 420 and 421 may be configured to apply gain to the intermediate signals vamp and vamn (wherein the gain applied is in proportion to the amplitude of the intermediate signals vamp and vamn). The drains of transistors 420 and 421 provide the output signals tail1 and tail2 of linear amplifier 411, which are coupled to non-linear gain section 402.

When linear gain section 401 operates normally, transistors 420 and 421 may be biased by mode controller 410 in such a manner that linear amplifier 411 may apply linear gain to the intermediate vamn and vamp signals. In contrast, when linear gain section 401 operates in bypass mode, mode controller 410 may bias the intermediate signals vamn and vamp such that transistors 420 and 421 saturate and force the output of linear amplifier 411 to go to ground. In one embodiment, one of the intermediate signals (e.g. vamp) may be biased to saturate one of the transistors (e.g. transistor 420) while the other intermediate signal (e.g. vamn) may be biased to not saturate the other transistor (e.g. transistor 421). This configuration advantageously turns off one-half of linear amplifier 411.

Non-linear gain section 402 includes a switching amplifier 430. The frequency modulating inputs f(t) are coupled through capacitors and produce intermediate signals Lop and Lon, which are in turn coupled to the inputs of switching amplifier 430. In one embodiment, the intermediate signals Lop and Lon may additionally be biased in an amount proportional to the gain signal coupled to non-linear gain section 402 (i.e. gain<5:0>).

Switching amplifier 430 includes a first transistor structure 431 and a second transistor structure 432. In one embodiment, each transistor structure may include two breakdown-resistant transistors 440. Breakdown-resistant transistors are described in U.S. Pat. No. 6,504,433, titled "CMOS Transceiver Having An Integrated Power Amplifier", issued on Jan. 7, 2003, which is hereby incorporated by reference. In this embodiment, an ncas signal may be used to bias the other transistors of transistor structures 431 and 432. In this example, output of dual mode power amplifier 400 comes from non-linear gain section 402, while the linear and non-linear gain sections are coupled together in a well-known mixer configuration. In other embodiments, the output of dual mode power amplifier 400 may come from linear gain section 401, the mixer, or from other elements within dual mode power amplifier 400. As shown, the output of dual mode power amplifier 400 may be in a differential format. In other embodiments, the output may be single-ended.

In this embodiment, the Gain1 signal adjusts the bias voltage "phbias" of dual mode power amplifier 400. In non-linear mode, the bias voltage is set by the Gain1 signal, which will decrease or increase the gate voltage of the bottom two transistors of transistor structure 431. Ideally, these two gates of transistor structure 431 should be set to equal their threshold voltages. Adjusting the gate voltages of the bottom two transistors of transistor structure 431 will adjust the current drawn by transistor structure 431 and increase the gain of the dual mode power amplifier. In this implementation, the transistor structure 432 is turned off in the non-linear mode, so transistor structure 432 is not affected by the Gain1 signal. In linear mode, the Gain1 signal will adjust the gate voltages of the bottom two transistors of each of transistor structure 431 and transistor structure 432 to make sure that the proper DC conditions are met for the linear mode power amplivier. Further gain adjustments in linear mode can be set by the Gain2 signal, which will increase or decrease the input a(t).

In one embodiment that saves power when the dual mode power amplifier is transmitting GFSK modulated data, either first transistor structure 431 or second transistor structure 432 may be disabled. For example, if first transistor structure 431 is disabled, then approximately one-half of the transmitter power may be saved. As is well-known, the transistor structure may be disabled in many ways, such as by adjusting bias voltages.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. For example, in another embodiment, dual mode power amplifier 400 may be configured as a Cartesian amplifier. Accordingly, it is intended that the scope of the invention be defined by the following claims and their equivalents.

The invention claimed is:
1. A dual mode power amplifier comprising:
a non-linear gain section receiving frequency modulating inputs and a first gain signal;
a linear gain section receiving amplitude modulating inputs, the first gain signal, and a mode select signal, the linear gain section being configured to selectively output a constant based on the mode select signal; and
a mixer configured to mix outputs of the non-linear gain section and the linear gain section, and generate a mixed signal as an output of the dual mode power amplifier.

2. The dual mode power amplifier of claim 1, wherein the non-linear gain section includes a switching amplifier that receives the frequency modulating inputs and the first gain signal.

3. The dual mode power amplifier of claim 2, wherein the switching amplifier includes a plurality of transistor structures, each transistor structure including breakdown-resistant transistors.

4. The dual mode power amplifier of claim 2, wherein the linear gain section includes:
- a mode controller for receiving the mode select signal and the first gain signal;
- a linear amplifier for receiving the amplitude modulating inputs and a second gain signal output by the mode controller; and
- a multiplexer for receiving an output of the linear amplifier and the constant, and generating an output of the linear gain section, the multiplexer being controlled by the mode controller.

5. The dual mode power amplifier of claim 4, wherein the mode controller is configured to saturate at least one device of the linear amplifier using the second gain signal.

6. A method of selectively providing one of Gaussian frequency-shift keying (GFSK) modulation and differential phase-shift keying (DPSK) modulation, the method comprising:
- coupling frequency modulating inputs to a non-linear gain section;
- coupling amplitude modulating inputs to a linear gain section;
- coupling a first gain signal to the non-linear and linear gain sections;
- configuring the linear gain section in one of a normal mode and a bypass mode; and
- mixing outputs of the non-linear and linear gain sections to generate an amplifier output signal.

7. The method of claim 6, wherein when the linear gain section is configured in the bypass mode, an output of the linear gain section is a unity value and the amplifier output signal is GFSK modulated.

8. The method of claim 6, wherein when the linear gain section is configured in the bypass mode, an output of the linear gain section is a constant value and the amplifier output signal is GFSK modulated.

9. The method of claim 6, wherein when the linear gain section is configured in the normal mode, the amplifier output signal is DPSK modulated.

* * * * *